United States Patent
Saeki et al.

(10) Patent No.: US 10,796,960 B2
(45) Date of Patent: Oct. 6, 2020

(54) MANUFACTURING PROCESS OF ELEMENT CHIP

(71) Applicant: Panasonic Intellectual Property Management Co., Ltd., Osaka (JP)

(72) Inventors: Hidefumi Saeki, Osaka (JP); Atsushi Harikai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/218,554

(22) Filed: Dec. 13, 2018

(65) Prior Publication Data

US 2019/0198396 A1  Jun. 27, 2019

(30) Foreign Application Priority Data

Dec. 25, 2017  (JP) .................................. 2017-248308

(51) Int. Cl.
| | |
|---|---|
| *H01L 21/78* | (2006.01) |
| *H01L 21/3065* | (2006.01) |
| *H01L 21/311* | (2006.01) |
| *H01L 21/268* | (2006.01) |
| *H01L 21/304* | (2006.01) |

(52) U.S. Cl.
CPC ............ *H01L 21/78* (2013.01); *H01L 21/268* (2013.01); *H01L 21/3043* (2013.01); *H01L 21/3065* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 8,703,581 B2 | 4/2014 | Lei et al. | |
| 2012/0322237 A1* | 12/2012 | Lei ........................ | H01L 21/78 438/462 |
| 2013/0149841 A1* | 6/2013 | Indyk ..................... | H01L 24/27 438/462 |
| 2016/0379884 A1* | 12/2016 | Ortner ................... | H01L 21/78 257/620 |

FOREIGN PATENT DOCUMENTS

| | | |
|---|---|---|
| JP | 2014-513868 A | 6/2014 |
| JP | 2014-523112 A | 9/2014 |
| WO | 2012/125560 A2 | 9/2012 |

* cited by examiner

*Primary Examiner* — Charles D Garber
*Assistant Examiner* — Xiaoming Liu
(74) *Attorney, Agent, or Firm* — Pearne & Gordon LLP

(57) ABSTRACT

A manufacturing process of an element chip, comprising a substrate preparing step for preparing a substrate having first and second sides opposed to each other, and including a plurality of dicing regions and element regions defined by the dicing regions, the first side being covered by a protective film, a first laser-grooving step for forming a plurality of grooves by irradiating a laser beam to the first side along the dicing regions, and a plasma-dicing step for plasma-etching the substrate along the grooves in depth through a plasma exposure, thereby to dice the substrate into a plurality of element chips, wherein the second side of the substrate and an annular frame are held on a holding sheet in the substrate preparing step, and wherein the laser beam is irradiated only in a region inside an outer edge of the substrate in the first laser-grooving step.

8 Claims, 7 Drawing Sheets

MANUFACTURING PROCESS OF ELEMENT CHIP

CROSS REFERENCE TO RELATED APPLICATION

The present application is based on and claims priority under 35 U.S.C. § 119 with respect to the Japanese Patent Application No. 2017-248308 filed on Dec. 25, 2017, of which entire content is incorporated herein by reference into the present application.

TECHNICAL FIELD

The present invention relates to a manufacturing process of an element chip produced by applying a laser-grooving technique and a plasma-etching technique.

BACKGROUND

Before individualizing (dicing) a semiconductor substrate into a plurality of element chips by the plasma-etching technique, a protective mask (a protective film) is formed to protect elements regions in which electric circuitries are arranged as described in Patent Document 1 (JP 2014-513868 A or WO 2012/125560 A2) and Patent Document 2 (JP 2014-523112 A or U.S. Pat. No. 8,703,581 B2). After the protective film is formed above a side of the semiconductor substrate on which the electric circuitries are arranged, the semiconductor substrate is laser-scribed along a plurality of streets (dicing regions), which defines element regions each composing element chips, to form a plurality of grooves. Then, the substrate is plasma-etched along the grooves from a top side through a bottom side so as to form the individualized or diced element chips. Typically, when laser-grooving the substrate along the streets, the laser beam is irradiated across the whole substrate surface from a starting point beyond one outer edge through an ending point also beyond the other outer edge of the substrate.

The laser-grooving step is carried out while a bottom side of the substrate is held on a holding sheet. As mentioned above, when the laser beam is irradiated across the substrate from the starting point through the ending point both beyond the outer edges (i.e., on the holding sheet), the holding sheet may be scarred at the portions by the laser irradiation, and the portions outside the outer edges may be damaged which stretch or have through-holes therein. In such a condition, when the holding sheet is subjected to the plasma-etching step, the stretched and crimped portions of the holding sheet may insufficiently cool down, and/or the through-holes at the damaged portions of the holding sheet may leak a coolant gas therethrough also causing the holding sheet insufficiently cooled down, which produces a burning of the holding sheet. Furthermore, the through-holes in the holding sheet may cause an anomalous electric discharge in a plasma-dicing apparatus which results in severe damages on the electrode thereof.

SUMMARY

One aspect of the present invention relates to a manufacturing process of an element chip, which comprises a substrate preparing step for preparing a substrate having first and second sides opposed to each other, and including a plurality of dicing regions and element regions defined by the dicing regions, the substrate containing a protective film covering the first side thereof, a first laser-grooving step for forming a plurality of grooves by irradiating a laser beam to the first side of the substrate along the dicing regions, each of the grooves being shallower than a thickness of the substrate, and a plasma-dicing step for plasma-etching the substrate along the grooves in depth through a plasma exposure of the substrate, thereby to dice the substrate into a plurality of element chips each having the element region, wherein the second side of the substrate and an annular frame surrounding the substrate are held on a holding sheet in the substrate preparing step, and wherein the laser beam is irradiated only in a region inside an outer edge of the substrate in the first laser-grooving step.

DETAILED DESCRIPTION

Figure 1:
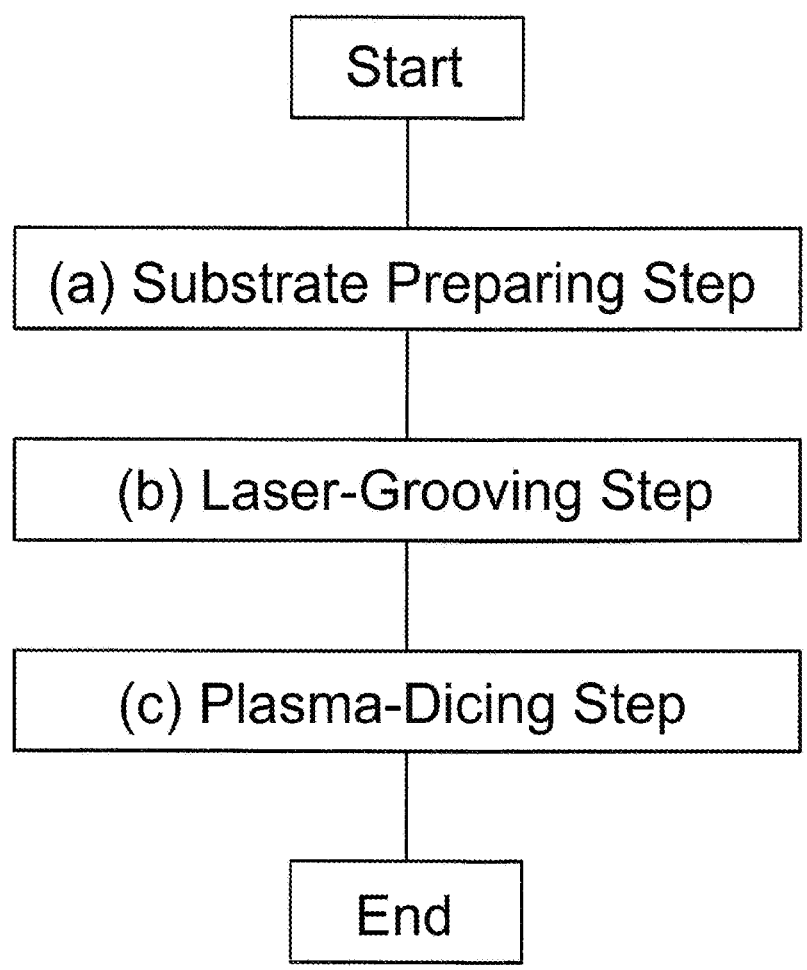
FIG. 1 is a flowchart illustrating a manufacturing process of an element chip according to an embodiment of the present invention.

With reference to attached drawings, a manufacturing process of an element chip according to an embodiment of the present invention will be described hereinafter. In the description, a couple of terms for indicating the directions (for example, "upper" and "lower") are conveniently used just for facilitating clear understandings, it should not be interpreted that those terms limit the scope of the present invention. Also, in the drawings, each component of the element chip is illustrated in a relative manner in size for clarifying the shape and the feature thereof, and not necessary in the exact scale.

As shown in a flowchart of FIG. 1, the manufacturing process of the element chip according to an embodiment of the present invention comprises, (a) a step (a substrate preparing step) for preparing a substrate including a plurality of dicing regions and element regions defined by the dicing regions, (b) a step (a first laser-grooving step) for forming a plurality of grooves along the dicing regions, each of which is shallower than a thickness of the substrate, and (c) a step (a plasma-dicing step) for plasma-etching the substrate along the grooves in depth to dice the substrate into a plurality of element chips.

(a) Substrate preparing Step: In this step, a substrate 1 is prepared, which is held on a holding sheet 3 together with an annular frame 2 surrounding the substrate 1. The substrate 1 contains first and second sides 1a, 1b opposed to each other. Also, the substrate 1 includes a plurality of element regions R1 and the dicing regions R2 defining each of the element regions R1. Furthermore, the first side 1a of the substrate 1 is covered by a protective film 13. The substrate 1 is held by a holding sheet 3 on the second side 1b thereof.

The substrate 1 prepared in the substrate preparing step is eventually individualized or diced into a plurality of element chips 14 by a plasma etching technique. The substrate 1 may a semiconductor substrate such as a silicon wafer, a resin board such as a flexible printed circuit board, or a ceramics substrate, for example. Also, the semiconductor substrate 1 may be made of silicon (Si), gallium arsenide (GaAs), gallium nitride (GaN), or silicon carbide (SiC), for example. The present invention is not limited to a special material of the substrate 1.

Figure 2A:
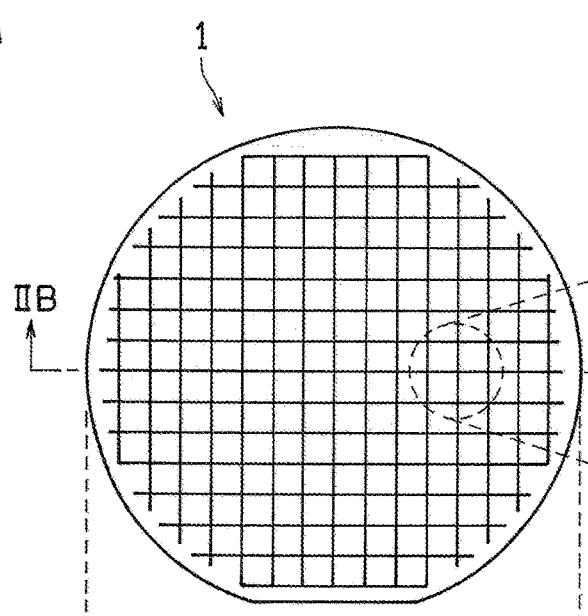
FIG. 2A is a schematic top plan view of a substrate.
Figure 2C:
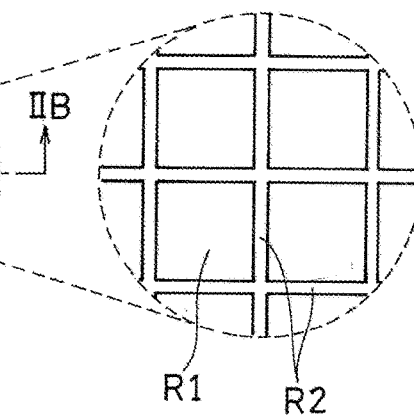
FIG. 2C is a partially enlarged view of FIG. 2A.
Figure 2B:
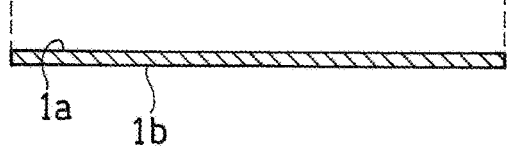
FIG. 2B is a cross-sectional view taken along a line IIB-IIB of FIG. 2A.

FIG. 2A is a schematic top plan view of a substrate 1, FIG. 2B is a cross-sectional view taken along a line IIB-IIB of FIG. 2A, and FIG. 2C is a partially enlarged view of FIG. 2A, which schematically illustrate the substrate 1. As shown in FIG. 2B, the substrate 1 has a first side 1a and the second side 1b opposed to each other, which are referred to as a top side 1a and bottom side 1b, respectively. Also, as shown in FIG. 2C, the substrate 1 includes a plurality of the element regions R1 and the dicing regions R2 defining each of the element regions R1 on the top side 1a of the substrate 1. In each of the element regions R1, the substrate 1 contains an integrated circuitry composing a desired electric circuitry, which forms the element chip 14 after the plasma-etching step as will be described hereinafter. Also, each of the streets or dicing regions R2 of the substrate 1 is used as dicing lines, along which the substrate 1 is diced.

The electric circuitry on the top side 1a in each of the element regions R1 contains a circuit layer 12 which may include a semiconductor circuitry, an electronic component, and/or MEMS, but not limited thereto. The circuit layer 12 may be structured as a multi-layered stack containing an insulating layer, a conducting layer, a resin protecting layer, an electrode pad and other components. After forming the multi-layered stack, the substrate 1 may be ground on the bottom side 1b in order to thin the substrate 1. More specifically, after a back-grinding (BG) tape is used to cover and protect the top side 1a, the substrate 1 may be ground on the bottom side 1b thereof.

The top side 1a of the substrate 1 is covered by a protective film 13 for protecting the element regions R1. The protective film 13 contains a resist material, including for example, a thermosetting resin such as polyimide, a photoresist such as a phenol resin, and a water-soluble resist such as an acrylic resin. The protective film 13 may be formed by forming a sheet of the resist material and attaching the sheet on the top side 1a of the substrate 1. Alternatively, it may be formed by using a coating technique such as a spin-coating technique and a spray-coating technique to apply a liquid mixture of the resist material onto the top side 1a of the substrate 1.

The protective film 13 may be formed before or after the substrate 1 is held on the holding sheet 3. Also, a thinner protective film 13 may be formed before the substrate 1 is held on the holding sheet 3, and then a thicker protective film may further be formed by attaching another sheet or coating the liquid mixture thereon.

The substrate 1 may have any planar shape, and for example, in a substantially circle as shown in FIG. 2A, or a rectangle (not shown). Besides, the substrate 1 may have a cut-out such as an orientation flat (FIG. 2A) and a notch. Although not limited thereto, the substrate 1 may have the maximum diameter in a range between 50 mm and 300 mm and a thickness in a range between 20 µm and 1000 µm.

Each of the streets or the dicing regions R2 may have any configuration such as zigzag and wave shapes instead of straight lines, which may be designed in accordance with the shape of the desired element chips 14. The element chips 14 may have shapes such as a rectangle and hexagon. Although not limited thereto, the streets or the dicing regions R2 may have a width selected in accordance with the size of the substrate 1 and/or the element chips 14. For example, the width of the streets R2 may be in a range between 10 µm and 30 µm.

Figure 3A:
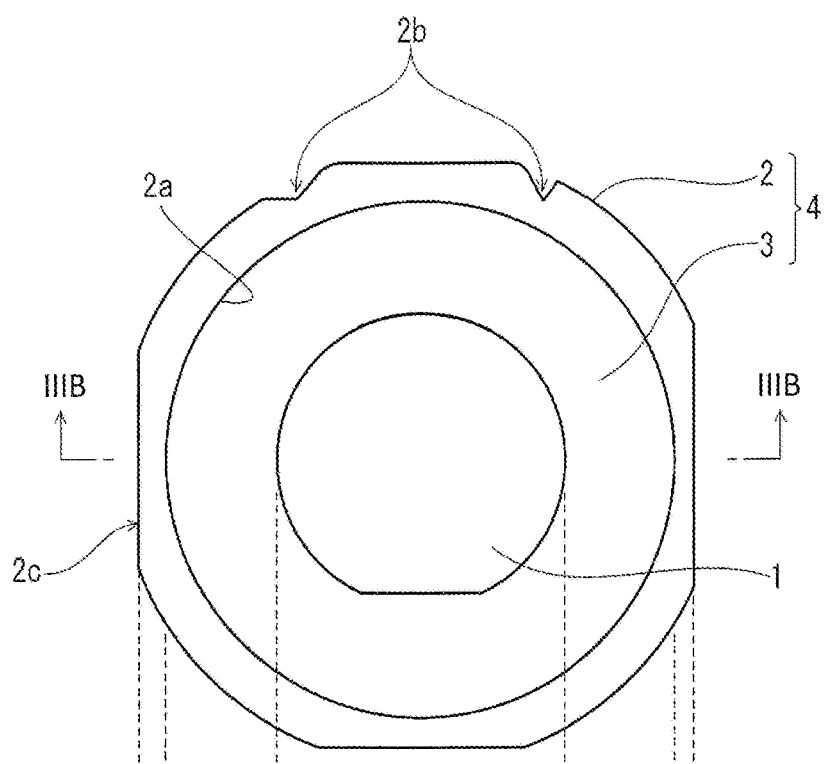
FIG. 3A is a schematic top plan view of a conveying carrier with the substrate held thereon.
Figure 3B:
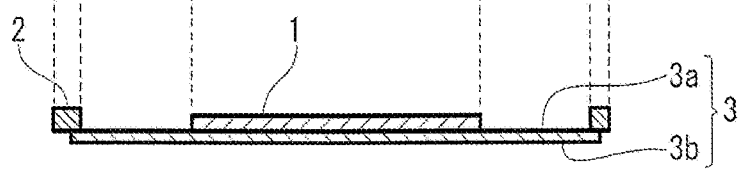
FIG. 3B is a cross-sectional view taken along a line of FIG. 3A.

FIG. 3A is a schematic top plan view of the substrate 1 held on the holding sheet 3, and FIG. 3B is a cross-sectional view taken along a line IIIB-IIIB of FIG. 3A. The holding sheet 3 includes an upper side 3a (an adhesive side) having an adhesive thereon and a lower side 3b (a non-adhesive side 3b) having no adhesive thereon. The holding sheet 3 holds the bottom side 1b of the substrate 1 and the annular frame 2 by adhering them on the adhesive side 3a thereof. The annular frame 2 has a circular opening 2a, and the holding sheet 3 adheres the substrate 1 and the frame 2 so that the circular opening 2a is arranged concentrically with the substrate 1, exposing a portion of the adhesive side 3a that is uncovered by the substrate 1. In the present disclosure, a combination of the holding sheet 3 and the frame 2 held thereon may be referred to as a conveying carrier 4, and substrate 1 held on the conveying carrier 4 may be referred to as an on-carrier substrate 1. Even if the substrate 1 itself is thin, since it is held on the conveying carrier 4, the substrate 1 can readily be manipulated in and delivered through the steps of the manufacturing process.

The holding sheet 3 has a base member (a backing member) made of a thermoplastic resin including, for example, polyolefin such as polyethylene and polypropylene, and polyester such as polyethylene terephthalate. Also, the holding sheet 3 preferably has a stretching property thereby to facilitate peeling off and picking up each of the element chips from the adhesive side 3a thereof. In order to add the stretching property, the base member of the holding sheet 3 may contain various additives including, for example, a rubber component (for example, ethylene-propylene rubber (EPM), ethylene-propylene-diene rubber (EPDM)), a plasticizer, a softener, an antioxidant, and a conductive material. The thermoplastic resin may contain a functional group showing a photopolymerization reaction such as an acryl group. Although not limited thereto, the base member may have a thickness in a range between 50 µm and 150 µm, for example.

The adhesive side 3a of the holding sheet 3 preferably contains an adhesive material of which adhesibility is weakened with an ultra-violet beam (UV-radiation). This allows each of the individualized element chips obtained after the plasma-dicing step to readily be peeled off and picked up from the adhesive side 3a with the UV-radiation. The holding sheet 3 may be formed, for example, by applying an UV-curing acrylic adhesive on the adhesive side 3a of a film-shaped base member to have a thickness in a range between 5 µm and 20 µm.

The frame 2 has such a rigidity that it can be transferred or delivered with the holding sheet 3 adhering the substrate 1. Besides the circular shape, the opening 2a of the frame 2 may be formed in a polygonal shape (such as a rectangle and a hexagon). As shown in FIG. 3A, the frame 2 may be provided with a notch 2b and/or a corner cut 2c for alignment thereof. Also, the frame 2 may be formed of, for example, a metal such as aluminum and stainless steel, or a resin.

Figure 4A:
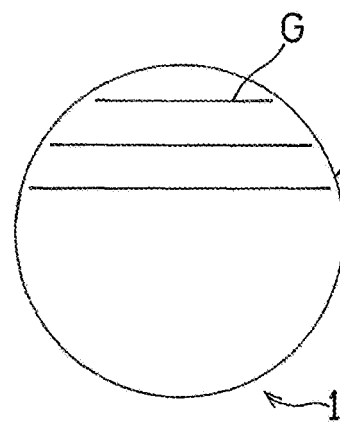
FIGS. 4A and 4B are schematic top plan views of the substrate, illustrating a first laser-grooving step.
Figure 4B:
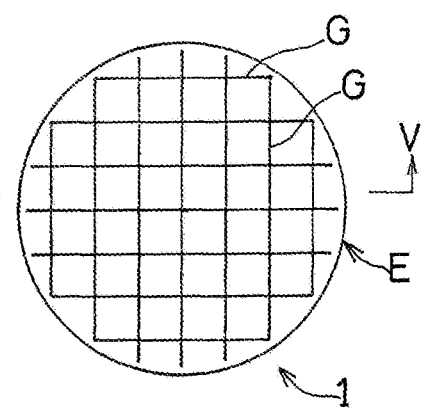
Figure 5:
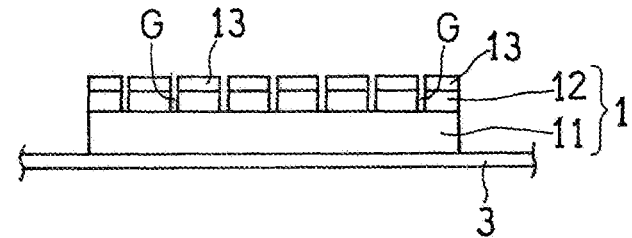
FIG. 5 is a cross-sectional view taken along a line V-V of FIG. 4B.

(b) First Laser-Grooving Step: FIGS. 4A and 4B are top plan views of the substrate 1, schematically illustrating a first laser-grooving step. FIG. 5 is a cross-sectional view taken along a line V-V of FIG. 4B. The substrate 1 shown in those drawings includes a base layer 11 made of semiconductor or the like, and a circuit layer 12 formed on the top side 1a which is covered by a protective film 13. In this step, the substrate 1 is irradiated with a laser beam from the top side 1a along a plurality of streets or dicing regions R2 to form a plurality of grooves G corresponding to the streets R2. The grooves G formed in this step have a depth shallower than a thickness of the substrate 1. Preferably, the grooves G are formed by mainly laser-scribing the protective film 13 and the circuit layer 12 with the laser beam along the streets R2 as illustrated in FIG. 5.

In the present embodiment, the laser beam is required to be irradiated on the substrate 1 only in a region inside an outer edge E of the substrate 1, i.e., not beyond the outer edges E thereof. This prevents the laser beam from irradiating on the holding sheet 3, thereby to substantially reduce or eliminate a damage on the holding sheet 3 without a scar by the laser irradiation. More particular, the holding sheet 3 is prevented from being stretched or perforated near the scarred portion. Therefore, the present embodiment in the plasma-dicing step suppresses a burning of the holding sheet 3 by avoiding a stretched and crimped portion thereof from being insufficiently cooled down, and/or by preventing a coolant gas from leaking through the penetrated holes also causing insufficient cooling down of the holding sheet 3. Furthermore, by eliminating the penetrated holes in the holding sheet 3, an anomalous electric discharge is avoided.

In the first laser-grooving step, the laser beam is irradiated only in the region inside the outer edge E of the substrate 1, rather on the holding sheet 3 located outside the outer edge E, so as to form a plurality of the grooves G. The minimum distance between the outer edge E and the ends of the grooves G is preferably 10 µm or greater. Also, in order to maximize the number of the element chips produced from the substrate 1, the minimum distance is preferably 1000 µm or less.

The depth of the grooves G formed in the first laser-grooving step is preferably 80% or more and 120% or less of the total thickness of the circuit layer 12 and the protective film 13, and more preferably 100% or more and 120% or less thereof. Thus, most or all of the circuit layer 12 and the protective film 13 are removed (and furthermore, the base layer 11 may partially be removed) so that the subsequent plasma-dicing step can be achieved in an efficient manner. The depth of the grooves G is defined as an average of those measured for any multiple points (e.g., 10 points) of any grooves G.

The laser beam may be irradiated once (single scanning irradiation) or more times (multiple scanning irradiations) for each of the streets or dicing regions R2. The number of laser radiations may be selected in accordance with the depth and/or shape of the desired grooves G, for example.

The first laser-grooving step may be achieved, for example, by using a laser beam source such as a nanosecond pulsed laser irradiating the laser beam of UV wavelength (e.g., 355 nm) along the streets or dicing regions R2 to remove the circuit layer 12 and the protective film 13, thereby forming the grooves G. Although the irradiation conditions of the laser beam are not limited thereto, the laser beam may be irradiated at a pulse period of 40 kHz, an output of 0.3 W, and a scan speed of 200 mm/s, for example.

Figure 6:
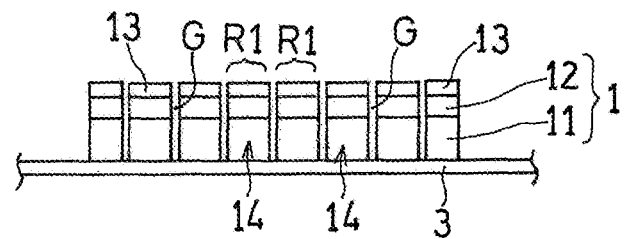
FIG. 6 is a cross-sectional view of the element chips after the substrate of FIG. 5 is diced in the plasma-dicing or plasma-etching step.

(c) Plasma-Dicing Step: FIG. 6 is a schematic cross-sectional view of the element chip 14 diced in the plasma-dicing step. In the plasma-dicing step, the substrate 1 including the grooves G formed in the first laser-grooving step is exposed to a plasma atmosphere so as to etch the remaining portion of the substrate 1 along the grooves in the depth direction, thereby dicing the substrate 1 into a plurality of the element chips 14 each having the element region R1 as illustrated in FIG. 6. The patterned protective film 13 obtained by forming the grooves G in the first laser-grooving step is used as a mask for plasma-etching the substrate 1 in the present step.

Although not illustrated in detail, an example of the plasma-dicing step and a dry-etching apparatus used therefor will be described below. The dry-etching apparatus contains a process chamber which includes a gas inlet fluidly connected to a processing gas source and an ashing gas source, and a gas outlet fluidly connected to a vacuum pump. After the conveying carrier 4 and the substrate 1 of FIG. 3 are seated on a stage within the process chamber, the process chamber is decompressed by means of the vacuum pump, and a predetermined processing gas is introduced into the process chamber. Then, the antenna of the dry-etching apparatus (a plasma generator) are supplied with the high-frequency power to generate the plasma atmosphere of the processing gas, in which the substrate 1 is dry-etched along the dicing regions R2 thereof and is diced into a plurality of the element chips 14 each having the element region R1 as illustrated in FIG. 6.

The dry-etching apparatus also includes a controller which controls the processing gas source (etching-gas source), the ashing gas source, the vacuum pump, and the high-frequency power source to carry out the plasma-etching step under the optimized dry-etching condition.

(d) Protective-Film Removing Step: After the plasma-dicing step, it is preferable to remove the remaining protective film 13 from the element chips 14. Removing the protective film 13 may be achieved by the ashing step. The ashing step may follow subsequently after the plasma-dicing step within the same process chamber. In the ashing step, an ashing gas such as an oxygen gas is introduced into the process chamber and the high-frequency power is supplied with the antennas (plasma generator) to generate the plasma atmosphere of the ashing gas so as to remove the protective film 13. Also, the protective film 13 may be removed by contacting it with a liquid cleaner dissolving the protective layer 13. As necessary, the ashing step may be combined with the cleaning step.

(e) Pick-up Step: After the plasma-dicing step or the protective-film removing step, the element chips 14 held on the holding sheet 3 are delivered to a pick-up step. In the pick-up step, each of the element chips 14 is peeled off the holding sheet 3 to obtain the element chip 14.

In the pick-up step, the holding sheet 3 may be spread in a radial direction to expand a gap between the adjacent element chips thereby to facilitate peeling off each of the element chips from the adhesive side 3a thereof. In the first laser-grooving step, since the laser beam is irradiated on the substrate 1 only in the region inside the outer edge of the substrate 1 (not beyond the outer edge thereof), the substrate 1 remains continuous or connected adjacent the outer edge E thereof, which may makes difficult to expand the holding sheet 3. In this case, the connected portion of the substrate 1 may be cut off or stripped before expanding the holding sheet 3.

In order to facilitate expanding the holding sheet 3, the substrate 1 is preferably plasma-etched in the plasma-dicing step without the protective film 13 formed in a peripheral region (including the outer edge E and a near-field region inside thereof) of the substrate 1. For example, the protective film 13 may be initially formed only within an inner region inside the peripheral region, or may be formed across the substrate 1 and then the portion thereof may be stripped which corresponds to and covers the peripheral region before the plasma-dicing step. The plasma-dicing step is preferably achieved while at least the protective film 13 is not formed in the peripheral region, and may be implemented while the protective film 13 and the circuit layer 12 are formed in the peripheral region (that is, while the protective film 13 and the circuit layer 12 are formed only in the inner region inside the peripheral region).

In the present disclosure, the step for removing the portion of the protective film 13 in the peripheral region may be referred to as a film-stripping step. The film-stripping step may be carried out before or after the first laser-grooving step. Also, in the film-stripping step, the circuit layer 12 may be removed or stripped in the peripheral region as well as the protective film 13, in which a portion or a whole in depth of the circuit layer 12 may be removed. Even in case that the protective film 13 in the peripheral region is stripped in the film-stripping step, the protective film 13 inside the peripheral region is removed in the aforementioned protective-film removing step.

Figure 7A:
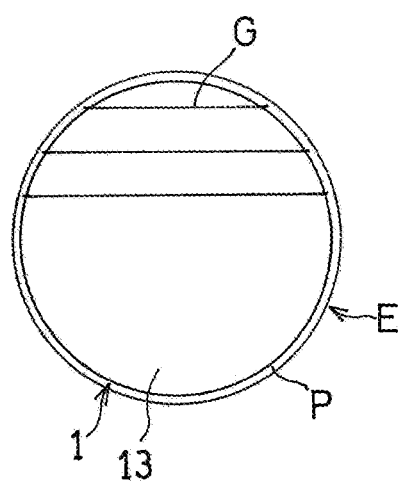
FIGS. 7A and 7B are schematic top plan views of the substrate, illustrating the first laser-grooving step without a protective film formed in a peripheral region thereof.
Figure 7B:
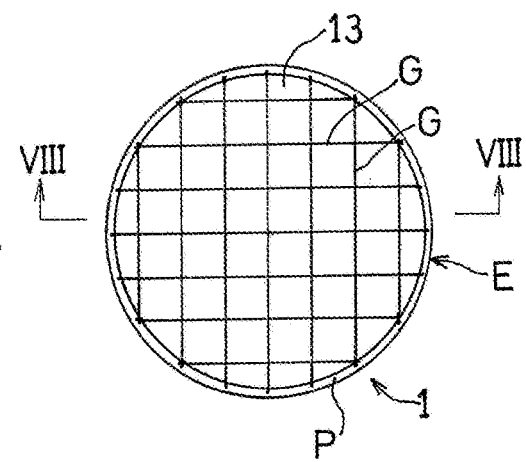
Figure 8:
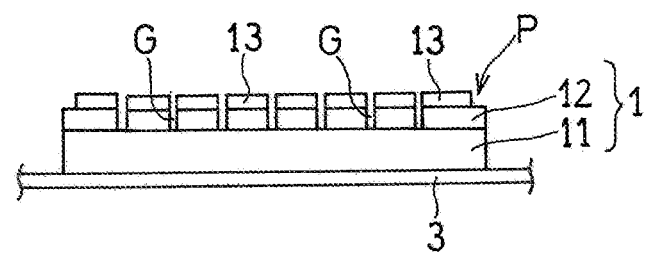
FIG. 8 is a cross-sectional view taken along a line VIII-VIII of FIG. 7B.

FIGS. 7A and 7B are schematic top plan views of the substrate 1, schematically illustrating the first laser-grooving step without the protective film 13 in the peripheral region P. FIG. 8 is a cross-sectional view taken along a line VIII-VIII of FIG. 7B. In the illustrated example, the laser beam is irradiated in the first laser-grooving step to form the grooves G without the protective film 13 in the peripheral region P of the substrate 1 (including the outer edge E and the near-field region inside thereof). When forming the protective film 13 on the top side 1a of the substrate 1, a spray-coating technique may be used for forming the protective film 13 only in an inner region further inside the peripheral region P of the substrate 1, or forming the protective film 13 across the top side 1a and then strip a portion thereof covering the peripheral region P. The portion of the protective film 13 covering the peripheral region P may be stripped by contacting it with the liquid cleaner dissolving the protective layer 13, or by irradiating the laser beam on it. This laser radiation step may be referred to as a second laser-grooving step.

Figure 9:
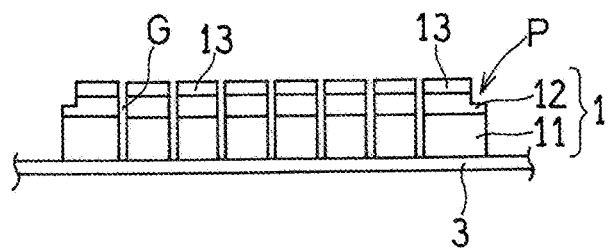
FIG. 9 is a cross-sectional view of the element chips after the substrate of FIG. 8 is diced in the plasma-etching step.

FIG. 9 is a cross-sectional view of the element chips after the substrate of FIG. 8 is diced in the plasma-etching step. The etching rate of the substrate 1 at an outer region may be greater than that at an inner region due to a micro-loading effect in the plasma-dicing step. As such, after the portion of the protective film 13 covering the peripheral region P is stripped and the grooves G are formed in the first laser-grooving step as illustrated in FIGS. 7A and 7B and FIG. 8, the plasma-dicing step may slightly cut off the substrate 1 close to or near the peripheral region P so that the thickness of the substrate 1 is reduced in the peripheral region P as illustrated in FIG. 9. This facilitates the holding sheet 3 to be expanded in a reliable manner. Thus, the laser beam is preferably irradiated from at least some or all of the ends of the grooves G positioned in the peripheral region P. This further facilitates the holding sheet 3 to be expanded because the grooves G connect the thinned region or the peripheral region P of the substrate 1.

Figure 10A:
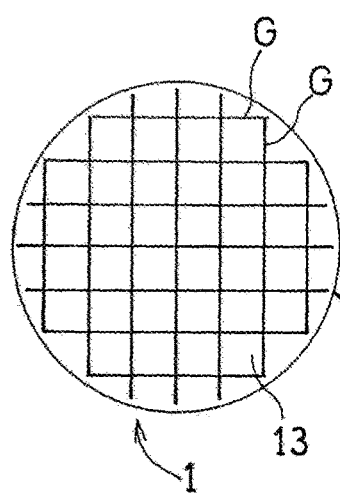
FIGS. 10A and 10B are schematic top plan views of the substrate with the protective layer removed in the peripheral region thereof after the first laser-grooving step.
Figure 10B:
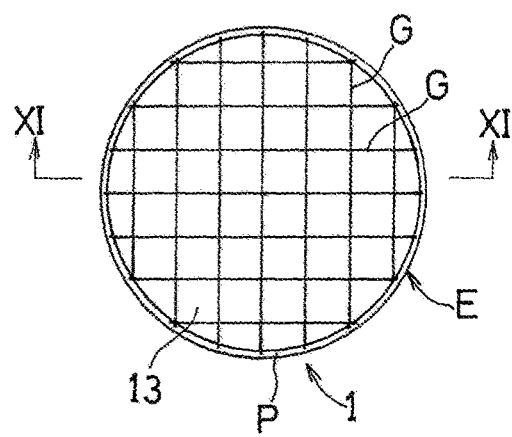
Figure 11:
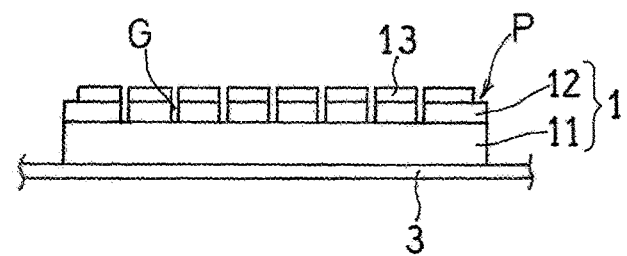
FIG. 11 is a cross-sectional view taken along a line XI-XI of FIG. 10B.

FIGS. 10A and 10B are top plan views of the substrate 1 with the protective film 13 removed in the peripheral region P thereof after the first laser-grooving step. FIG. 11 is a cross-sectional view taken along a line XI-XI of FIG. 10B. In the illustrated example, after the laser beam is irradiated in the first laser-grooving step to form the grooves G, the portion of the protective film 13 covering the peripheral region P is stripped, which may be performed by contacting it with the liquid cleaner dissolving the protective layer 13, or by irradiating the laser beam on it (i.e., the second laser-grooving step). When the substrate 1 is plasma-etched in the plasma-dicing step after stripping the portion of the protective film 13 in the peripheral region P, the substrate 1 has a cross-section as shown in FIG. 9, thereby to achieve the advantage similar to those as described above.

Figure 12A:
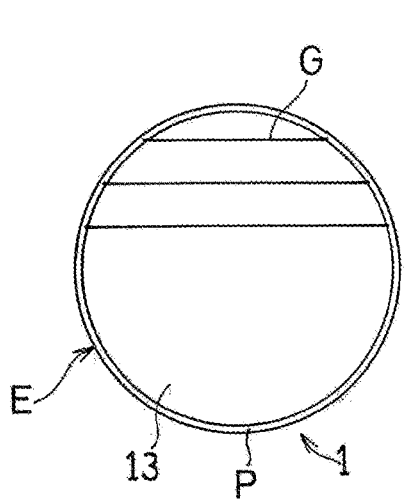
FIGS. 12A and 12B are schematic top plan views of the substrate without the protective film and the circuit layer formed in the peripheral region thereof, illustrating the first laser-grooving step.
Figure 12B:
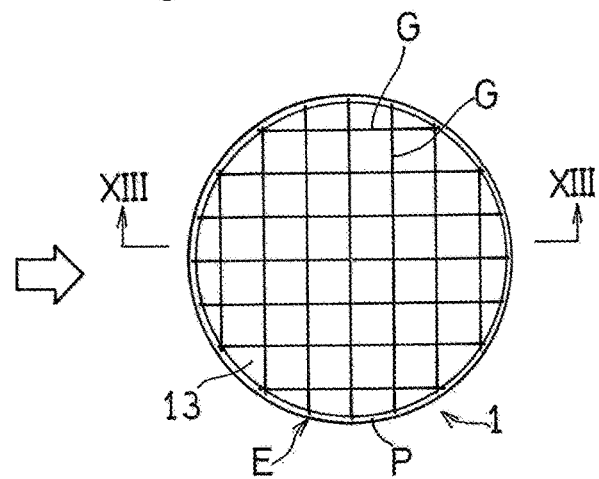
Figure 13:
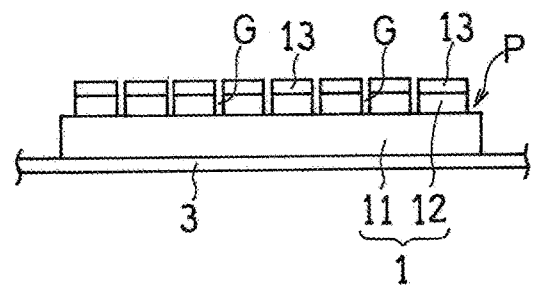
FIG. 13 is a cross-sectional view taken along a line XIII-XIII of FIG. 12B.

FIGS. 12A and 12B are top plan views of the substrate 1 without the protective film 13 and the circuit layer 12 formed in the peripheral region P thereof, schematically illustrating the first laser-grooving step. FIG. 13 is a cross-sectional view taken along a line XIII-XIII of FIG. 12B. In the illustrated example, the laser beam is irradiated in the first laser-grooving step to form the grooves G without the protective film 13 and the circuit layer 12 formed in outer edge E and the peripheral region P thereof. In this instance, the circuit layer 12 is formed only in a region inside the peripheral region P above the top side 1a of the substrate 1, and then the spray-coating technique is used for forming the protective film 13 only in the region inside the peripheral region P thereof. Alternatively, the protective film 13 may be formed so as to cover across the top side 1a of the substrate 1, followed by stripping a portion of the protective film 13 and the circuit layer 12 that cover the peripheral region P. The portion of the protective film 13 covering the peripheral region P may be stripped by contacting it with the liquid cleaner dissolving the protective layer 13, or by irradiating the laser beam on it in the second laser-grooving step. Also, the portion of the circuit layer 12 in the peripheral region P may be stripped in the second laser-grooving step.

Figure 14:
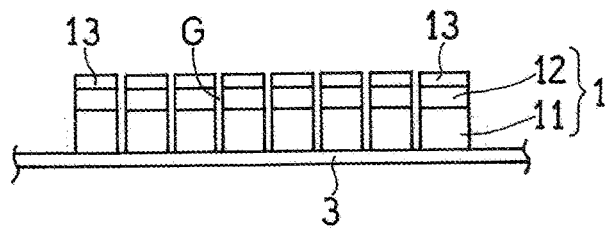
FIG. 14 is a cross-sectional view of the element chips after the substrate of FIG. 13 is diced in the plasma-etching step.

FIG. 14 is a cross-sectional view of the element chips after the substrate 1 of FIG. 13 is diced in the plasma-etching step. After the laser beam is irradiated in the first laser-grooving step to form the grooves G without the protective film 13 and the circuit layer 12 formed in the peripheral region P thereof as shown in FIG. 13, the plasma-etching step may be performed so that the substrate 1 is fully etched through the holding sheet 3 in the peripheral region P as well as in the grooves G as shown in FIG. 14, which also facilitates the holding sheet 3 to be expanded in a reliable manner. The laser beam is preferably irradiated from at least some or all of the ends of the grooves G positioned in the peripheral region P. This further facilitates the holding sheet 3 to be expanded because the grooves G connect the region corresponding to the peripheral region P of the substrate 1.

In the second laser-grooving step, the laser beam may be irradiated onto the peripheral region P along the outer edge E of the substrate 1, in a manner similar to the first laser-grooving step. Since the second laser-grooving step is performed for stripping the protective film 13, the irradiation condition of the second laser-grooving step may be determined in accordance with the material and the thickness of the protective film 13.

The present invention may be applicable to the manufacturing process of the element chips which are produced with the holding sheet for holding the substrate, since the holding sheet is prevented from being damaged when the substrate is subjected to the laser-grooving step.

REFERENCE NUMERALS

1: substrate, 1a: first side (top side), 1b: second side (bottom side), R1: element region, R2: street (dicing region), 2: frame, 2a: opening, 2b: notch, 2c: corner cut, 3: holding sheet, 3a: adhesive side, 3b: non-adhesive side, 4: conveying carrier, 11: base layer, 12: circuit layer, 13: protective film, 14: element chip, G: grooves, E: outer edge, P: peripheral region

What is claimed is:

1. A manufacturing process of an element chip, comprising:
    a substrate preparing step for preparing a substrate having first and second sides opposed to each other, and including a plurality of dicing regions and element regions defined by the dicing regions, the first side being covered by a protective film;
    a first laser-grooving step for forming a plurality of grooves by irradiating a laser beam to the first side of the substrate along the dicing regions, each of the grooves being shallower than a thickness of the substrate;
    a plasma-dicing step for plasma-etching the substrate along the grooves in depth through a plasma exposure of the substrate, thereby to dice the substrate into a plurality of the element chips each having the element region; and
    a removing step for removing the protective film from the plurality of the element chips after the plasma-dicing step,
    wherein the second side of the substrate and an annular frame surrounding the substrate are held on a holding sheet in the substrate preparing step,
    wherein the laser beam is irradiated only in a region inside an outer edge of the substrate in the first laser-grooving step, and
    wherein the substrate is plasma-etched along the grooves and a peripheral region of the substrate in the plasma-dicing step in a state without the protective film in the peripheral region.

2. The manufacturing process of the element chip according to claim 1, wherein the protective film is formed only in an inner region inside the peripheral region of the substrate.

3. The manufacturing process of the element chip according to claim 2,
    wherein the substrate contains a circuit layer on the first side thereof, and
    wherein the circuit layer is formed only in the inner region inside the peripheral region of the substrate.

4. The manufacturing process of the element chip according to claim 1, further comprising a film-stripping step for stripping the protective film that covers the peripheral region of the substrate before the plasma-dicing step,
    wherein at least some of ends of the grooves are positioned in the peripheral region of the substrate in the first laser-grooving step.

5. The manufacturing process of the element chip according to claim 4, wherein the film-stripping step includes a second laser-grooving step for stripping the protective film that covers the peripheral region of the substrate by irradiating the laser beam to the first side of the substrate along the outer edge thereof.

6. The manufacturing process of the element chip according to claim 4, wherein the substrate contains a circuit layer on the first side thereof, and wherein the circuit layer in the peripheral region is stripped in the film-stripping step as well as the protective film.

7. The manufacturing process of the element chip according to claim 1, wherein the minimum distance between the outer edge of the substrate and the ends of the grooves is 10 µm or greater.

8. The manufacturing process of the element chip according to claim 1, wherein the minimum distance between the outer edge of the substrate and the ends of the grooves is 1000 µm or less.

* * * * *